United States Patent [19]

McDiarmid et al.

[11] Patent Number: 5,493,987
[45] Date of Patent: Feb. 27, 1996

[54] CHEMICAL VAPOR DEPOSITION REACTOR AND METHOD

[75] Inventors: James McDiarmid, Pleasanton; Kristian E. Johnsgard, San Jose, both of Calif.

[73] Assignee: AG Associates, Inc., Sunnyvale, Calif.

[21] Appl. No.: 243,394

[22] Filed: May 16, 1994

[51] Int. Cl.$^6$ ............................................. C23C 16/00
[52] U.S. Cl. ........................... 117/102; 117/84; 117/88; 118/715; 118/725; 118/728
[58] Field of Search .................... 118/725, 715, 118/728; 117/84, 88, 102

[56] References Cited

U.S. PATENT DOCUMENTS 4,951,601  8/1990  Mayden et al. .................... 118/719
5,156,820  10/1992  Wong et al. ..................... 422/186.05

Primary Examiner—Richard Bueker
Attorney, Agent, or Firm—Albert C. Smith

[57] ABSTRACT

A CVD reactor and method for growing semiconductor material upon a selected surface of a semiconductor wafer supported within the reactor includes a plurality of heat shields that are arranged relative to the peripheral edge and underside of the wafer to alter the radiation of flux from the wafer that is heated to elevated temperatures by a bank of high-intensity lamps that are oriented to illuminate the upper side of the wafer through a transparent wall of the reactor. A reactant gas flowing into the chamber from above the wafer is inhibited from flowing about the underside of the wafer, thereby assuring wafers that are not contaminated on the underside.

22 Claims, 4 Drawing Sheets

5,493,987

CHEMICAL VAPOR DEPOSITION REACTOR AND METHOD

FIELD OF THE INVENTION

This invention relates to chemical vapor deposition (CVD) reactors and more particularly to a reactor for providing improved thermal uniformity across a large-area silicon semiconductor wafer, and for providing improved immunity from contamination or deposition on the backside of the wafer.

BACKGROUND OF THE INVENTION

In a conventional CVD reactor for depositing semiconductor material on a monocrystalline substrate of semiconductor material, a decomposable gas such as silane or trichlorosilane or dichlorosilane is directed over the surface of a silicon wafer to decompose on contact with the hot wafer and deposit silicon on the silicon wafer. Such decomposition commonly occurs in a cold-wall reactor to reduce the decomposition of the gas and the deposition of one or more constituent elements of the gas on the walls of the reactor. Such depositions on the walls of the reactor may accumulate and constitute a source of contamination in subsequent epitaxial depositions on a series of wafers being processed, and may also obliterate the transmission of high-intensity light flux through a window-wall of the reactor from an external light source to the wafer heated thereby within the reactor.

In addition, since gaseous decomposition and deposition of the CVD layer depend critically upon reaction temperature, various schemes are commonly employed to assure substantially isothermal temperature distribution over the entire area of the wafer. In some known reactors, a wafer is supported by a susceptor that is disposed in thermally conductive contact with the underside of the wafer to assure substantially uniform temperature distribution over the area of the wafer. However, a susceptor positioned on the underside of a wafer substantially to serve as an isothermal mass across the dimensions of the wafer also significantly increases the time required to elevate the temperature of the wafer (typically to temperatures of about 1000° C.), and also tends to contaminate the backside of a wafer. In addition, since the area of the wafer increases as the square of unit increments of radius of the wafer, substantial portions of the area of a wafer are contained near the outer perimeter of the wafer. These areas of the wafer are oriented within the reactor closest to the cold walls of the chamber, and therefore tend to lose heat more rapidly via radiation to the adjacent cold walls than the center regions of the wafer which are more remote from the cold walls and which are essentially edge-wise "surrounded" by the integral perimeter portions of the wafer that are at substantially elevated temperature. Accordingly, larger wafers tend to present substantially greater difficulties in maintaining a desirable isothermal temperature distribution over the surface of the wafer for more uniform deposition over the entire surface of the wafer, and for better crystal quality in terms of dislocations commonly preferred to as 'slip'.

The wafer temperature in conventional reactors is commonly controlled using banks of high-intensity lamps that are arranged outside the reactor chamber to irradiate the wafer through a cold-wall window in the reactor. However, as the decomposable gas flows through the reactor, some deposition occurs on the window that then becomes less optically transmissive and more absorptive of radiant flux from the lamps, with associated increase in window temperature, and increased rates of deposition on the window, in regenerative manner, with associated loss of thermal control of the wafer temperature as the window becomes less optically transmissive. For this reason, the reactor must be dismantled frequently in order to clean deposits from the window, with associated reduction in the throughput or production rate of wafers through the reactor over time.

SUMMARY OF THE INVENTION

In accordance with the present invention, an improved reactor including wafer supports and gas flow arrangements greatly improve the isothermal temperature distribution over the entire surface area of large semiconductor wafers, and greatly extend the operating intervals of the reactor between down times required to dismantle the reactor for cleaning of undesirable depositions from the window and other components of the reactor. Specifically, thermal shields are disposed about the wafer to inhibit radiation from the perimeter regions of a wafer including non-touching shields disposed beneath the wafer to control the thermal profile of the wafer as well as to inhibit the undesirable deposition of reaction products on the back side of the wafer. Additionally, gas inlets to the reaction chamber are oriented to inhibit the undesirable deposition of reaction products on the window.

DESCRIPTION OF THE PREFERRED EMBODIMENT

Figure 1:
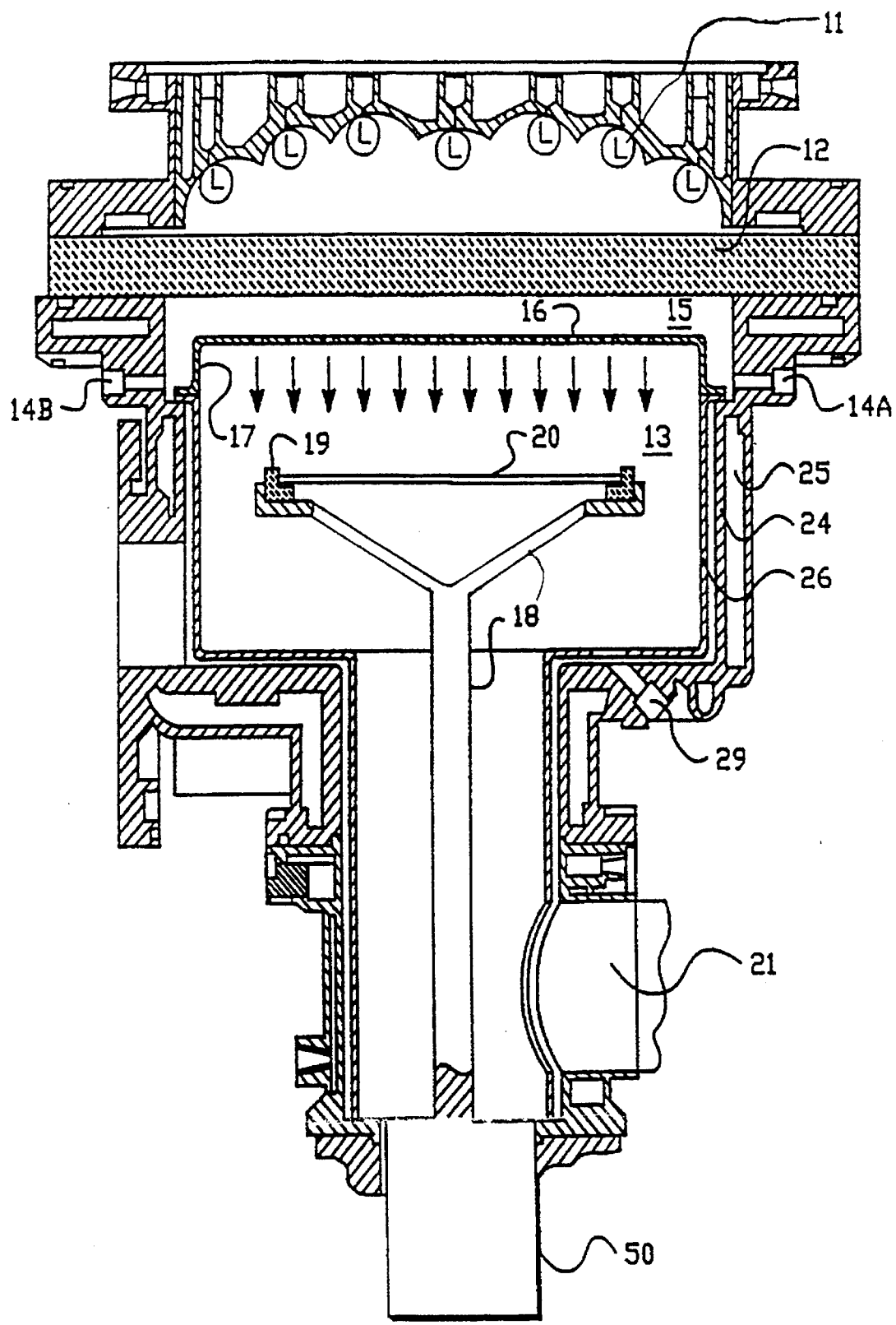
FIG. 1 is a sectional view of a conventional reactor.

Referring now to FIG. 1 there is shown a sectional view of one known form of reaction chamber 13 for depositing reactor products or decomposition elements of supplied gases on the surface of a semiconductor wafer 20 that is supported 19 on an elevating and rotating finger-like supporter and pedestal 18 for radiant heating through window 12 by a bank of high-intensity lamps 11. Reaction gases are admitted to the generally cylindrical reactor chamber 13 via inlets 14A and 14B positioned about the perimeter of the chamber to supply gases to an inner region 15. The gases thus introduced migrate up over the top of the sidewall 17 of the diffusion plate to the region 15 between the window 12 and a diffusion plate 17 that has a plurality of holes 16 therethrough for substantially uniformly distributing the reaction gases over the entire surface of the heated wafer 20. The entire chamber may be lined with an inner liner 26 of quartz to provide a cool-wall interior substantially free of undesirable contaminants. This known reactor chamber includes a viewing port 29 for an optical pyrometer that can be aligned with the backside of the wafer 20 for non-contacting temperature measurements of the wafer 20, and also includes a wafer-rotating and elevating mechanism 50 of conventional design for positioning a wafer 20 in the radiant field of the bank of lamps 11, and also includes a vacuum port and gas outlet 21 and various external fluid passages 25 distributed about the chamber for cooling the entire structure.

It should be noted that in such a known reactor chamber, the peripheral portions of the wafer 20 thus supported within the chamber are more closely positioned adjacent the cool walls of the structure than the central portions of the wafer 20. In certain known installations, the wafer support 19 may include a susceptor (or radiation absorber) and radiation barrier positioned as an annulus about the perimeter of the wafer 20 to be radiantly heated by the lamps and to conductively heat the rim of the wafer 20 as well as to impede radiation of heat from the wafer edge toward the adjacent cool walls 24, 26 of the reactor. However, such susceptor 19 commonly introduces a source of contamination on the backside and edges of the wafer 20 in contact therewith, and commonly interferes with smooth, uniform gas flow over the surface of the wafer. In addition, the reaction gases introduced into the region 15 adjacent the window 12 via the inlets 14A and 14B are capable of decomposing and forming undesirable deposits on the window 12 that reduce its overall optical transmissivity and increase its temperature via absorption of the radiant flux from lamp 11. In this regenerative sequence, more undesirable deposition per unit time occurs on the window 12 as the window 12 with accumulated deposition absorbs more radiant flux, until the window 12 becomes unusable and must be removed from the chamber for cleaning. Also, the finger-like support and pedestal 18 permits optical targeting on the backside of the wafer 20 for an optical pyrometer to sense radiation from the wafer 20 and, hence, determine its temperature as a function of sensed radiant flux and the emissivity of the backside of the wafer 20. However, since the finger-like support and pedestal 18 does not shield the backside of the wafer 20 from circulating gases, deposition also occurs on the backside of the heated wafer as the gases decompose, thereby adversely affecting the emissivity of the wafer 20 and disrupting accurate determination of wafer temperature via optical pyrometry.

Figure 2:
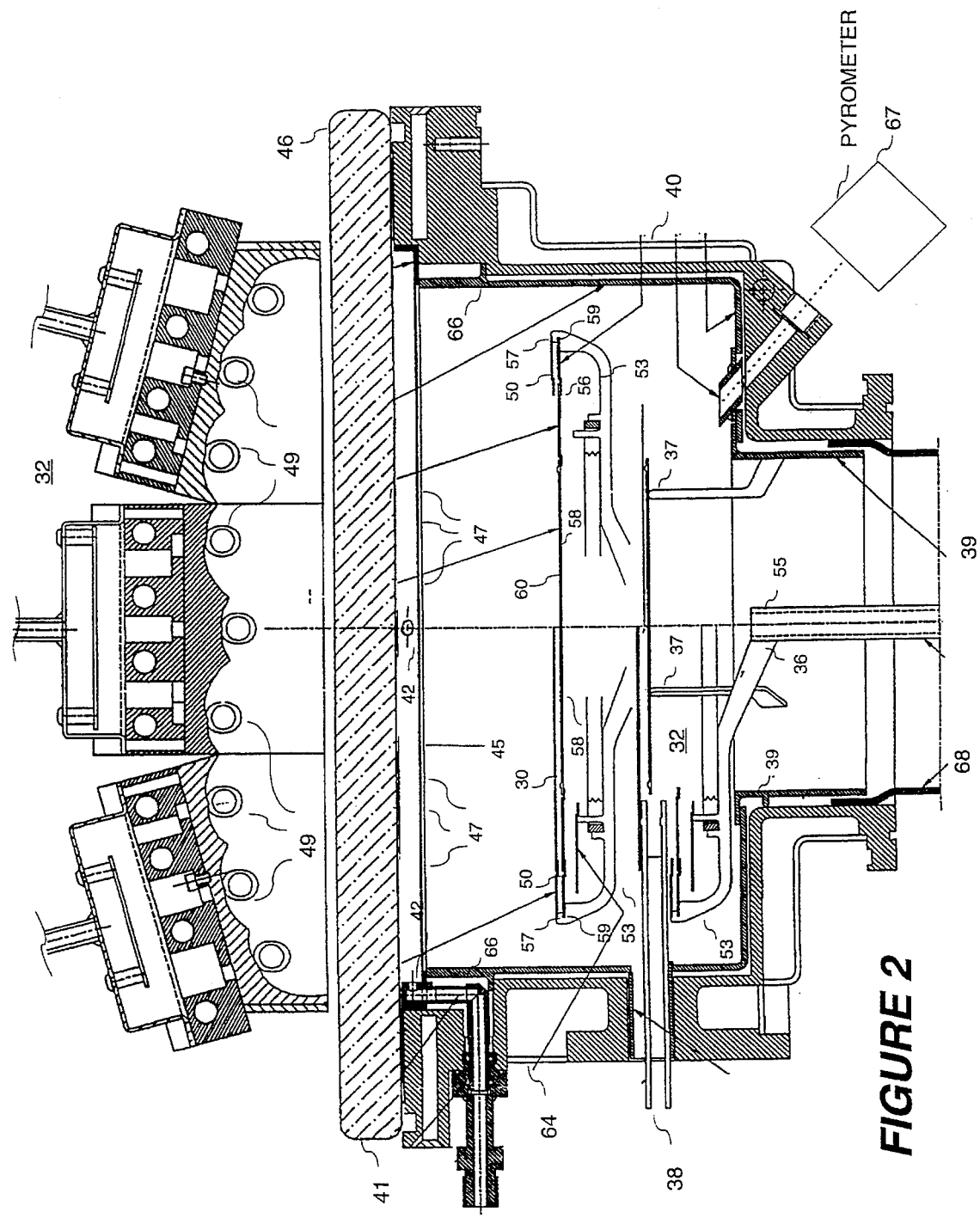
FIG. 2 is a sectional view of a CVD reactor according to the present invention.
Figure 3:
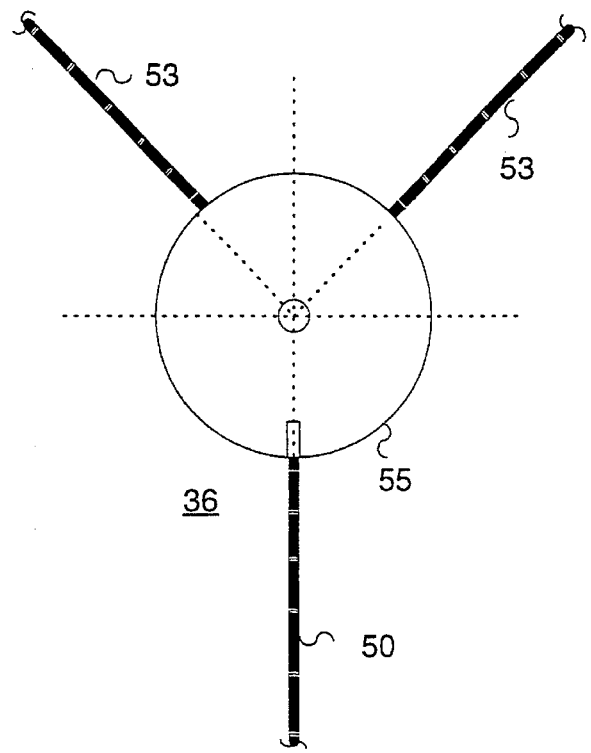
FIG. 3 is a top view of a supporter for the wafer within the reactor of FIG. 2.
Figure 4:
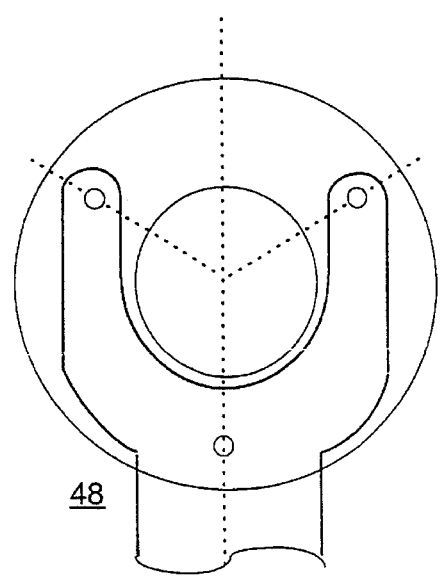
FIG. 4 is a top view of a wafer handling 'paddle' for placing and retrieving wafers within the reactor.

In accordance with the illustrated embodiment of the present invention, there is shown in FIG. 2 a sectional view of a generally cylindrical CVD reactor chamber in which a large-diameter wafer 30 is supported for radiative heating by the bank 32 of high-intensity lamps 49. A finger-like wafer supporter 36 as illustrated in the top view of FIG. 3, is shown for convenient analysis at each of two operating positions, namely, at a lower position 32 below a set of wafer standards 37 that support a wafer during loading and unloading via the chamber access port 38, and at an upper position 34 for supporting a wafer 30 in reaction position in the upper region of the chamber. The wafer standards 37 are typically formed of quartz and are attached to the inner liner 39, which is also typically formed of quartz, to provide substantially planar support for a wafer at a selected elevation relative to the access port 38. In this way, a conventional robotic wafer-handling "paddle" 48, for example, as illustrated in the top view of FIG. 4, may place and retrieve wafers on the standards 37 through the access port 38. A wafer thus placed on the standards 37 may thereafter be elevated by the finger-like supporter 36 which is operated in conventional manner to rotate, as desired, and raise up from the lower position 32 to the upper position 34 with the wafer 30 positioned on the supporter 36 above the standards 37. In this position, the backside of a wafer 30 may be sensed by an optical pyrometer 67 of conventional design disposed to view the backside of a wafer through the viewing port 40 that is aligned with the backside of a wafer in the elevated position 34.

In accordance with the present invention, the wafer 30 in elevated position is disposed to be rapidly heated by the radiant energy from the bank 32 of high-intensity lamps 49 that are disposed above the quartz window 46 to radiate the wafer 30 in the reactor chamber. Reactant gases may be admitted into the reactor chamber via gas inlets 41 selectively distributed about the periphery of the reactor chamber beneath the window 46. A gas diffusion plate 45 formed of clear quartz and having a plurality of holes 47 therethrough is disposed beneath the window 46 and above the wafer 30 in elevated position to assure substantially uniform distribution and flow of reactant gases over the surface of the wafer 30.

It has been determined that the temperature profile over the entire surface of a large wafer (typically, 200 mm in diameter) can be made more uniform for more uniformly distributed deposition by incorporating radiation shields and support rings in selective array about the wafer 30. Specifically, the wafer 30 is supported within an upper annulus 50 formed, for example, of silicon carbide or silicon carbide coated graphite for selective radiation absorption. The annulus 50 includes a step or recess 52 to receive the wafer 30 with the upper surface thereof substantially in plane-parallel relationship with the upper surface of the annulus 50. The annulus 50 and associated step support for a wafer have been determined to inhibit radiation from the edges of the wafer 30, and also render more uniform the flow of gases over the surface of the wafer 30 before altering direction around the remote perimeter edge of the annulus 50. In addition, the step 52 in the annulus 50 for loosely supporting the wafer 30 thereon assures that thermal expansion of the wafer at varying temperatures will be relieved and will not promote mechanical stresses within the wafer 30. The annulus 50 is supporting on finger-like radial extensions 53 of the central pedestal 55 in convenient steps or notches 57 in each extension (typically, only three, as shown in FIG. 3).

In addition, it has been determined that the temperature profile over the surface plane of the wafer 30 and annulus 50 can be more uniformly maintained with the aid of a heat shield 56, 58, 60 positioned in close, spaced relationship to the backside of the wafer 30 and annulus 50. Accordingly, the shield 56, 58, 60 is supported on another step 59 of each of the finger-like extensions 53 below the steps 57 that support the annulus 50. Specifically, the heat shield 54 is formed of an outer, lower annulus 56 that supports an inner, lower annulus 58 that, in turn, may support an inner or central disk 60. Alternatively, the central disk 60 may be supported at a lower elevation along the finger-like extensions of the pedestal-supporter 36, for example, as illustrated in the alternate position 62 in FIG. 2. Additionally, a radiation shield in the form of an annulus 64 is also supported beneath the outer, lower annulus 56 and inner, lower annulus 58 to inhibit radiant heat loss to the cool walls of the reactor chamber. Annulus 64 is spaced away from of the heat shield 56, 58, 60 typically by a greater distance than such heat shield is spaced from the back side of the wafer 30. Of course, the reactor chamber may also include quartz liners 56, 39, 68 for cool-wall operation to restrict contamination sources as much as possible. The heat shields including the lower, outer and inner annulus 56, 58 and central disk 60 may be formed of such materials as silicon carbide or silicon carbide coated graphite.

In operation, the edges of a wafer 30 are inhibited from radiating heat toward the cool reactor walls by the upper annulus 50 that surrounds the wafer 30, and by the lower heat shield 56, 58, 60 that is supported in close proximity to the backside of the wafer 30. Such backside heat shield 56, 58, 60 of this construction attains substantial thermal equilibrium with the wafer 30 very rapidly, attributable to radiant heating from the back side of the wafer 30 as it is heated up by the bank of lamps 32. In addition, the upper annulus 50 disposed about the perimeter of the wafer 30 effectively extends the surface area of the wafer 30, without significant surface anomalies, for improving the uniformity of flow of reactant gases at least over the surface of the wafer 30 (and beyond over the annulus 50) before encountering a termination of the surface plane at the outer perimeter of the annulus 50. Therefore, any disturbances such as eddies and turbulence in the smooth flow of gases over the wafer surface only occur at locations removed from the wafer surface, and therefore do not affect uniformity of the epitaxial deposition on the upper surface of the wafer 30.

Figure 5:
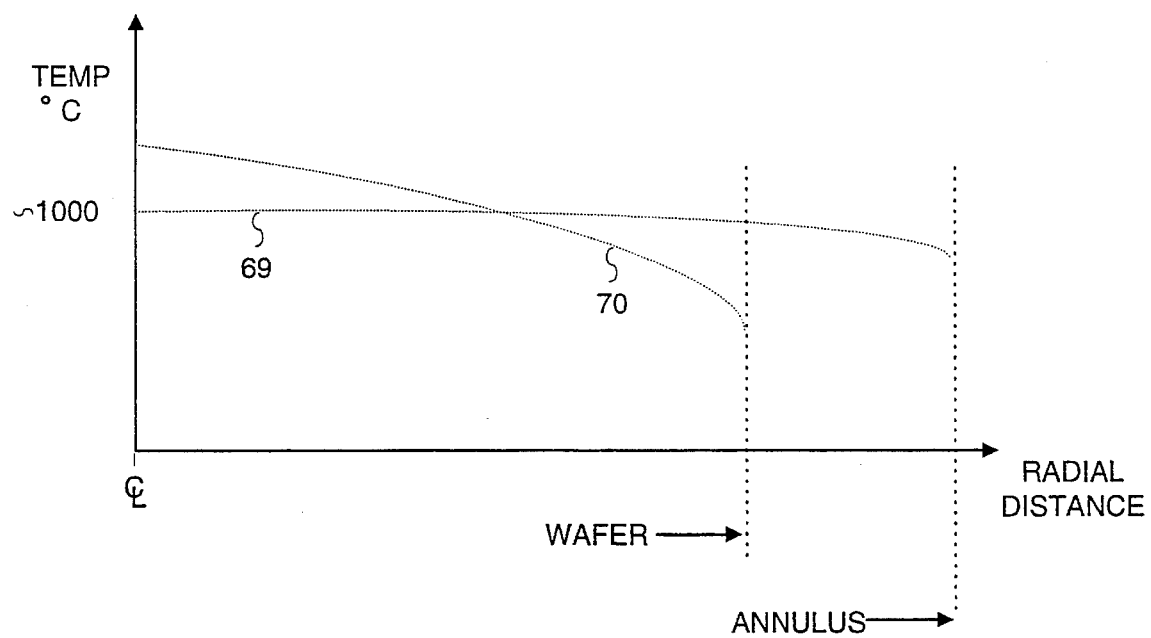
FIG. 5 is a graph illustrating a family of temperature profiles associated with various configuration of heat shields in the reactor of FIG. 2.

The heat shield 56, 58, 60 that is supported in close proximity to the backside of the wafer 30, in association with the upper annulus 50, assure substantially uniform temperature distribution over the surface area of the wafer 30 (and beyond toward the perimeter of the upper annulus 50, where the temperature profile tends to drop with distance toward the perimeter of annulus 50, as shown (by curve 69 in FIG. 5). The lower heat shield 56, 58, 60 contributes to the uniformity of the wafer temperature profile by inhibiting radiative heat loss from the backside of the wafer 30 as well as from the backside of the upper annulus 50. Since radiation and conductive heat losses are considerably lower near the center of a wafer 30 due to the surrounding heated outer portions of the wafer 30 and the more remote locations of cool reactor walls, and because of the backside heat shield 56, 58, 60 it may be appropriate to displace the central portion of the heat shield further below the wafer, as illustrated at 62 in FIG. 2. This promotes sufficient radiation heat loss from the backside of the wafer 30 to more uniformly distribute the temperature profile over the entire surface of the wafer 30 from a thermal gradient 71 to an isothermal distribution 69, as illustrated in FIG. 5. And, the lower-most annulus 64 may also be positioned below the perimeter of the outer, lower annulus 56 and inner, lower annulus 58 to control the radiative heat loss from these portions of the heat shield 56, 58, 60 and thereby control its temperature profile, which thereby also contributes to the uniformity of the temperature profile of the wafer 30 over its entire surface area.

Figure 6:
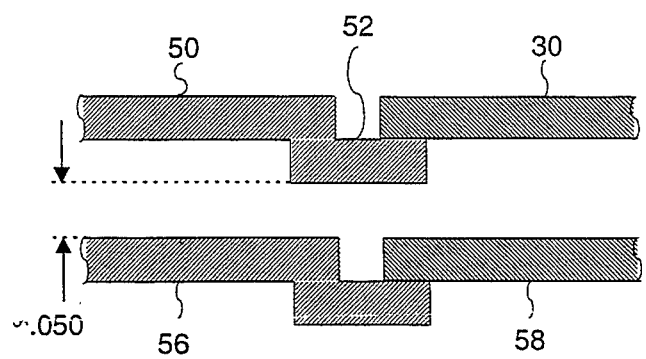
FIG. 6 is a sectional view of the wafer and heat shield orientation within the reactor of FIG. 2.

The heat shield 56, 58, 60 thus positioned in close proximity to the backside of the wafer 30 also inhibits gas flow and associated epitaxial deposition on the backside of the wafer 30. Specifically, the heat shield 56, 58, 60 is spaced about 0.050 inches away from the lower side of the step support in the upper annulus 50 that supports the wafer 30, as illustrated in the sectional view of FIG. 6. Thus, without anything to establish a pressure differential between the backside of wafer 30 and the heat shield 56, 58, 60 no reactant gas is caused to flow therebetween to form any deposition on the backside of the wafer 30. Rather, any eddies or turbulence in gas flow over the perimeter edge of the upper annulus 50 thus tends to engage substantially only the outer perimeter of the underside of the heat shield 56, 58, 60 with little or no resulting deposition on the backsides of the upper annulus 50, and with no resulting deposition on the central region of the backside of the wafer 30 within the region bounded by the descending step 52 in the upper annulus 50. Residual gases and purge gases and reactant gases are removed downwardly from the reactor chamber through the lower regions lined by walls 39, 68 to an outlet port (not shown).

Reactant gas for providing the deposition on the surface of the wafer 30 is caused to flow smoothly over wafer 30 (and over the outer perimeter of the upper annulus 50) by introducing the reactant gas under pressure through inlet jets 41, 42 that are positioned above the transparent, apertured diffusion plate 45 and below the window 46 in order to move the gas with a directed velocity well in excess of conventional migration of gas flow up over an elevated barrier and then generally non-directionally within the region between diffusion plate 45 and a window 46, for example, in an embodiment of a reactor chamber as illustrated in FIG. 1. Specifically, it has been determined that at least two inlet jets 42 disposed substantially at 90° intersecting orientations about the perimeter of the diffusion plate 45 provide improved flow of reactant gas relative to the window 46 and through the diffusion plate 45. Such orientation of the inlet jets 42 is believed to promote intersecting gas streams which leave no significant pockets or regions between diffusion plate 45 and window 46 in which gas flow is stagnant or slow moving, and from which undesirable depositions onto the window 46 or diffusion plate 45 can result. Thus, high-velocity, intersecting streams of reactant gas in the region between diffusion plate 45 and window 46 has been determined to preserve the window 46 and diffusion plate 45 clear of undesirable deposits over longer operational intervals between cleaning requirements than were previously possible. And, such flow of intersecting gas streams has been determined to pass substantially uniformly through the diffusion plate 45 and over the surface of the wafer 30 for substantially uniform deposition over the surface of the wafer 30.

Therefore, the epitaxial reactor and method of the present invention provides more uniform temperature profile over the entire surface area of large-diameter semiconductor wafers, and promotes more uniform flow of reactant gas over the wafer for improved uniformity of deposition without significant contamination or deposition on the backside of the wafer.

What is claimed is:

1. Reactor apparatus for forming CVD depositions on a semiconductor wafer, the reactor apparatus comprising:

a chamber including walls forming boundaries about the chamber, and including an upper wall of the chamber that is substantially transparent to radiation within a selected waveband for admitting radiant flux into the chamber through the upper wall;

source means of radiant flux disposed adjacent the upper wall of the chamber for supplying radiant flux within a selected waveband into the chamber;

support means disposed within the chamber for positioning a semiconductor wafer in selected position adjacent the upper wall for receiving radiant flux therethrough, said support means including an outer annulus having a recess therein for supporting a semiconductor wafer within the recess of the annulus; and a heat shield disposed in close proximity to the underside of the outer annulus and to the underside of a semiconductor wafer supported by the annulus, said heat shield being positioned in substantially plane-parallel relationship to the outer annulus and a semiconductor wafer supported thereby.

2. Reactor apparatus according to claim 1 wherein the heat shield is disposed within approximately 0.050 inches from the underside of the outer annulus for inhibiting flow of gas therebetween.

3. Reactor apparatus according to claim 1 wherein the heat shield further comprises a lower annulus and a central shield disposed within a selected portion of inner area of the lower annulus and within the surface area of a semiconductor wafer supported by the outer annulus.

4. Reactor apparatus according to claim 3 wherein said central shield is disposed in substantially plane-parallel relationship to the lower annulus and extends with the lower annulus to substantially support the outer dimension of the outer annulus and a semiconductor wafer supported therein.

5. Reactor apparatus according to claim 3 wherein said central shield is spaced away from the underside of a semiconductor wafer supported in the outer annulus by a distance greater than the distance of the lower annulus away from the under side of such semiconductor wafer for altering the radiation of flux from the under side of the semiconductor wafer.

6. Reactor apparatus according to claim 5 comprising:

optical detection means disposed to view through a wall of the chamber the underside of the heat shield.

7. Reactor apparatus according to claim 3 comprising:

an auxiliary annulus disposed below the heat shield near the outer perimeter thereof and spaced away therefrom for altering the radiation of flux from the underside of the heat shield.

8. Reactor apparatus according to claim 1 comprising:

a gas diffusion plate having a plurality of gas passages therethrough and being substantially transparent to radiation in the selected waveband, said gas diffusion plate being supported within the chamber intermediate the upper wall and the outer annulus and a semiconductor wafer supported thereby for directing flow of a gas substantially over the wafer and the outer annulus.

9. Reactor apparatus according to claim 8 comprising:

inlet means disposed about the periphery of the chamber for introducing a gas into the chamber intermediate the upper wall and the gas diffusion plate for flow therethrough to the semiconductor wafer and outer annulus.

10. Reactor apparatus according to claim 9 wherein said inlet means includes at least two inlets disposed intermediate the upper wall and the gas diffusion plate at intersecting angular displacements about the perimeter of the chamber for introducing a gas of selected composition into the chamber in intersecting streams.

11. Reactor apparatus according to claim 10 wherein the inlets are oriented at approximately 90-degree orientation about the periphery of the chamber.

12. A method of forming epitaxial deposition on a semiconductor wafer in a reaction chamber having an upper wall that is substantially transparent to radiant flux within a selected waveband, the method comprising the steps of:

supporting the wafer within the chamber adjacent the upper wall for receiving radiant flux therethrough;

surrounding the periphery of the wafer with an upper heat shield surrounding the wafer for altering radiation of flux from the wafer; and supporting a lower heat shield within the chamber in close proximity to the underside of the wafer and the surrounding upper heat shield, said lower heat shield being positioned in substantially plane-parallel relationship to the under side of the wafer and the upper heat shield surrounding the wafer for altering radiation of flux from the wafer and upper heat shield.

13. The method according to claim 12 wherein in the step of supporting a lower heat shield, the lower heat shield is disposed within approximately 0.050 inches from the underside of the upper heat shield for inhibiting flow of gas therebetween.

14. The method according to claim 12 wherein in the step of supporting a lower heat shield, a central portion of the lower heat shield having a selected inner area is positioned remote from the under side surface of a wafer for altering the radiation of flux from the central region of the wafer.

15. The method according to claim 14 wherein the lower heat shield is disposed to extend to substantially the outer dimension of the upper heat shield surrounding a semiconductor wafer.

16. The method according to claim 14 wherein the central portion of the lower heat shield is spaced away from the underside of a semiconductor wafer and surrounding upper heat shield by a distance greater than the distance of the lower heat shield away from the under side of such semiconductor wafer for altering the radiation of flux from the under side of the semiconductor wafer.

17. The method according to claim 16 comprising the step of optically detecting through a wall of the chamber radiant flux from the underside of a semiconductor wafer for determining the underside of the lower heat shield.

18. The method according to claim 12 comprising the step of supporting an auxiliary heat shield below the lower heat shield near the outer perimeter thereof and spaced away therefrom for altering the radiation of flux from the underside of the lower heat shield.

19. The method according to claim 12 comprising the step of diffusing a gas into the chamber from above the wafer supported therein for directing flow of a gas substantially over the wafer and the upper heat shield as a substantially planar surface.

20. The method according to claim 19 wherein in the step of diffusing a gas into the chamber, gas is introduced into the chamber beneath the upper wall for diffusion and flow to the semiconductor wafer and upper heat shield.

21. The method according to claim 19 wherein the step of diffusing a gas into the chamber includes introducing gas into the chamber in at least two intersecting streams beneath the upper wall and above the wafer and surrounding upper heat shield.

22. The method according to claim 21 wherein in the step of diffusing a gas into the chamber includes introducing two gas streams at approximately 90-degree orientation about the periphery of the chamber.

* * * * *